(12) United States Patent
Zhou

(10) Patent No.: US 10,048,559 B2
(45) Date of Patent: Aug. 14, 2018

(54) ARRAY SUBSTRATE AND SEMICONDUCTOR DEVICE CONTAINING THE SAME, AND METHOD FOR FABRICATING THE SAME

(71) Applicants: BOE TECHNOLOGY GROUP CO., LTD, Beijing (CN); HEFEI XINSHENG OPTOELECTRONICS TECHNOLOGY CO., LTD., Hefei (CN)

(72) Inventor: Jideng Zhou, Beijing (CN)

(73) Assignees: BOE TECHNOLOGY GROUP CO., LTD, Beijing (CN); HEFEI XINSHENG OPTOELECTRONICS TECHNOLOGY CO. LTD., Hefei (CN)

( * ) Notice: Subject to any disclaimer, the term of this patent is extended or adjusted under 35 U.S.C. 154(b) by 0 days.

(21) Appl. No.: 15/509,281

(22) PCT Filed: Oct. 10, 2016

(86) PCT No.: PCT/CN2016/101692
§ 371 (c)(1),
(2) Date: Mar. 7, 2017

(87) PCT Pub. No.: WO2017/059825
PCT Pub. Date: Apr. 13, 2017

(65) Prior Publication Data
US 2017/0285380 A1    Oct. 5, 2017

(30) Foreign Application Priority Data

Oct. 10, 2015    (CN) .......................... 2015 1 0654443

(51) Int. Cl.
*H01L 27/14*    (2006.01)
*G02F 1/1368*    (2006.01)
(Continued)

(52) U.S. Cl.
CPC ........ *G02F 1/1368* (2013.01); *G02F 1/13439* (2013.01); *G02F 1/134309* (2013.01);
(Continued)

(58) Field of Classification Search
CPC .... G02F 1/0009; G02F 1/0045; G02F 1/0305; G02F 1/0316; G02F 1/13; G02F 1/1306;
(Continued)

(56) References Cited

U.S. PATENT DOCUMENTS

2001/0011985 A1* 8/2001 Kikkawa ........... G02F 1/134363
345/92
2002/0118330 A1    8/2002 Lee
(Continued)

FOREIGN PATENT DOCUMENTS

CN    202339463 U    7/2012
CN    103323988 A    9/2013
(Continued)

OTHER PUBLICATIONS

The World Intellectual Property Organization (WIPO) International Search Report and Written Opinion for PCT/CN2016/101692 dated Dec. 30, 2016 13 Pages.
(Continued)

*Primary Examiner* — Syed Gheyas
(74) *Attorney, Agent, or Firm* — Anova Law Group, PLLC

(57) ABSTRACT

The present disclosure provides an array substrate. The array substrate includes a substrate having a display region with a plurality of pixel regions, each pixel region having two or more first regions; a common electrode line between two adjacent pixel regions; a gate line; a data line intersecting with the gate line; at least one of the gate line and the data line being in a second region between two adjacent first regions; and a pixel electrode having a hollowed-out pattern (Continued)

within a corresponding first region, pixel electrodes corresponding to the two or more first regions being a pixel electrode unit.

20 Claims, 6 Drawing Sheets

(51) Int. Cl.
G02F 1/1362 (2006.01)
G02F 1/1343 (2006.01)
H01L 27/12 (2006.01)

(52) U.S. Cl.
CPC .. G02F 1/136213 (2013.01); G02F 1/136227 (2013.01); G02F 1/136286 (2013.01); G02F 2001/136295 (2013.01); G02F 2201/121 (2013.01); G02F 2201/122 (2013.01); G02F 2201/123 (2013.01); G02F 2203/01 (2013.01); H01L 27/124 (2013.01); H01L 27/1255 (2013.01)

(58) Field of Classification Search
CPC ............. G02F 1/133611; G02F 1/1337; G02F 1/134336; G02F 2001/134345; G02F 1/134363
See application file for complete search history.

(56) References Cited

U.S. PATENT DOCUMENTS

| 2012/0013835 | A1* | 1/2012 | Itoh | G02F 1/133707 |
| | | | | 349/123 |
| 2013/0188109 | A1 | 7/2013 | Chen | |
| 2014/0061818 | A1 | 3/2014 | Zhang | |
| 2016/0104722 | A1* | 4/2016 | Woo | H01L 27/124 |
| | | | | 257/72 |
| 2016/0181286 | A1 | 6/2016 | Hao | |

FOREIGN PATENT DOCUMENTS

| CN | 104007591 A | 8/2014 |
| CN | 104035247 | 9/2014 |
| CN | 104049429 A | 9/2014 |
| CN | 104536213 | 4/2015 |
| CN | 105223749 A | 1/2016 |
| CN | 205003420 U | 1/2016 |

OTHER PUBLICATIONS

State Intellectual Property Office of the P.R.C (SIPO) Office Action 1 for 201510654443.7 dated Nov. 16, 2017 17 Pages (including translation).

* cited by examiner

ARRAY SUBSTRATE AND SEMICONDUCTOR DEVICE CONTAINING THE SAME, AND METHOD FOR FABRICATING THE SAME

CROSS-REFERENCES TO RELATED APPLICATIONS

This application is a national phase entry under 35 U.S.C. § 371 of International Application No. PCT/CN2016/101692, filed on Oct. 10, 2016, which claims priority to Chinese Patent Application No. 201510654443.7, filed on Oct. 10, 2015. The above enumerated patent applications are incorporated by reference herein in their entirety.

TECHNICAL FIELD

The present invention generally relates to the display technologies and, more particularly, relates to an array substrate, a semiconductor device containing the array substrate, and a method for fabricating the array substrate.

BACKGROUND

A transparent thin film transistor-liquid crystal display (TFT-LCD) panel is a display panel with high light transmission rate and is capable of displaying the objects behind the displayed images. Transparent TFT-LCD panels can be used as the TFT-LCD panels for many show windows, e.g., in buildings, bus stops, and shops. Besides the display functions, transparent TFT-LCD panels can also be used to provide desired information. Thus, transparent TFT-LCD panels have drawn much attention in the display market. The transparent TFT-LCD panels will likely occupy display markets in buildings, billboards, public places, etc. The development of transparent TFT-LCD panels can help the development of the entire market of TFT-LCD panels.

BRIEF SUMMARY

The present disclosure provides an array substrate, a semiconductor device containing the array substrate, and a method for fabricating the array substrate. The transparent TFT-LCD panel containing the array substrate may have improved light transmission rate.

One aspect of the present disclosure includes an array substrate, including: a substrate having a display region with a plurality of pixel regions, each pixel region having two or more first regions; a common electrode line between two adjacent pixel regions; a gate line; a data line intersecting with the gate line; at least one of the gate line and the data line being in a second region between two adjacent first regions; and a pixel electrode having a hollowed-out pattern within a corresponding first region, pixel electrodes corresponding to the two or more first regions being a pixel electrode unit.

Optionally, each pixel electrode corresponds to a first region, and an area of the pixel electrode corresponds to an area of the first region.

Optionally, the array substrate further includes a first insulating layer being between the gate line and the data line; and a second insulating layer being between the data line and the pixel electrode unit.

Optionally, a pixel region includes four first regions arranged in a two by two configuration; and the gate line and the data line are in the second region being perpendicular to each other.

Optionally, hollowed-out patterns of two adjacent pixel electrodes are axisymmetric.

Optionally, the hollowed-out pattern includes one or more of slit shapes and stripe shapes.

Optionally, the array substrate further includes a thin-film transistor, the thin-film transistor including a gate electrode being integrated with the gate line; first electrodes being electrically connected to the pixel electrode; a second electrode being integrated with the data line; an active layer being electrically connected to the first electrodes and the second electrode. The data line, the common electrode line, and first electrodes are over the gate electrode, the data line, the common electrode line, and the first electrodes being separated from the gate electrode by a first insulating layer; the gate electrode and the gate line are on the substrate; the active layer is on the gate electrode and is separated from the gate electrode by the first insulating layer, the active layer being electrically connected with the first electrodes and the second electrode; the second electrode of and the data line are one piece; and the pixel electrode unit is over the data line, the pixel electrode unit being connected to the first electrodes through first via holes, the first via holes being through the second insulating layer.

Optionally, the array substrate further includes a third insulating layer being between the second insulating layer and the pixel electrode; a first via holes being through the second insulating layer and the third insulating layer. The pixel electrode being connected to the first electrodes through the first via hole.

Optionally, the third insulating layer is made of an organic insulating material.

Optionally, the array substrate according further includes a storage electrode formed in areas corresponding to the common electrode line. The first insulating layer is between the storage electrode and the common electrode line; and the storage electrode is electrically connected to the pixel electrode and forms a storage capacitor structure with the common electrode line.

Optionally, the storage electrode is integrated with the gate line.

Optionally, at least one common electrode line substantially overlaps with the pixel electrode; and the second insulating layer is between the common electrode line and the pixel electrode.

Optionally, the pixel electrode is of a squared shape.

Another aspect of the present disclosure provides a semiconductor device, including a disclosed array substrate.

Optionally, the semiconductor device further includes a cover substrate with a clear region corresponding to the pixel electrode for improving light transmittance.

Another aspect of the present disclosure provides a method for fabricating an array substrate, including providing a substrate having a display region with a plurality of pixel regions, each pixel region having two or more first regions, and a second region between two adjacent first regions; forming a gate line and a gate electrode of a thin-film transistor on a substrate, the gate line and the gate electrode of the thin-film transistor being formed in a same fabrication step; and forming a first insulating layer; forming an active layer of the thin-film transistor, the active layer being located in an area where the gate line and a data line intersect. The method further includes forming a data line, common electrode lines between two adjacent pixel regions, first electrodes, and a second electrode, at least one of the gate line and the data line being formed in the second region; forming a second insulating layer and first via holes, the first via holes being through the second insulating layer and forming a pixel electrode with a hollowed-out pattern in the pixel region being connected to the first electrodes through the first via holes, the hollowed-out pattern corresponding to the first region.

Optionally, the hollowed-out pattern having one or more of slit shapes and stripe shapes; each pixel region includes four first regions arranged in a two by two configuration; and the gate line and the data line being perpendicular to each other are fabricated in the second region.

Optionally, the method further includes forming a third insulating layer on the second insulating layer, the first via holes being through the third insulating layer and the second insulating layer.

Optionally, the method further includes forming storage electrodes in areas corresponding to the common electrode lines, the storage electrodes and the gate line being formed in a same fabrication step; and forming second via holes in areas corresponding to the storage electrodes, the second via holes and the second insulating layer being formed in a same fabrication step, the second via holes being through the first insulating layer and the second insulating layer, and the pixel electrode being connected to the storage electrodes through the second via holes.

Optionally, the pixel electrode unit overlaps with at least one common electrode line.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
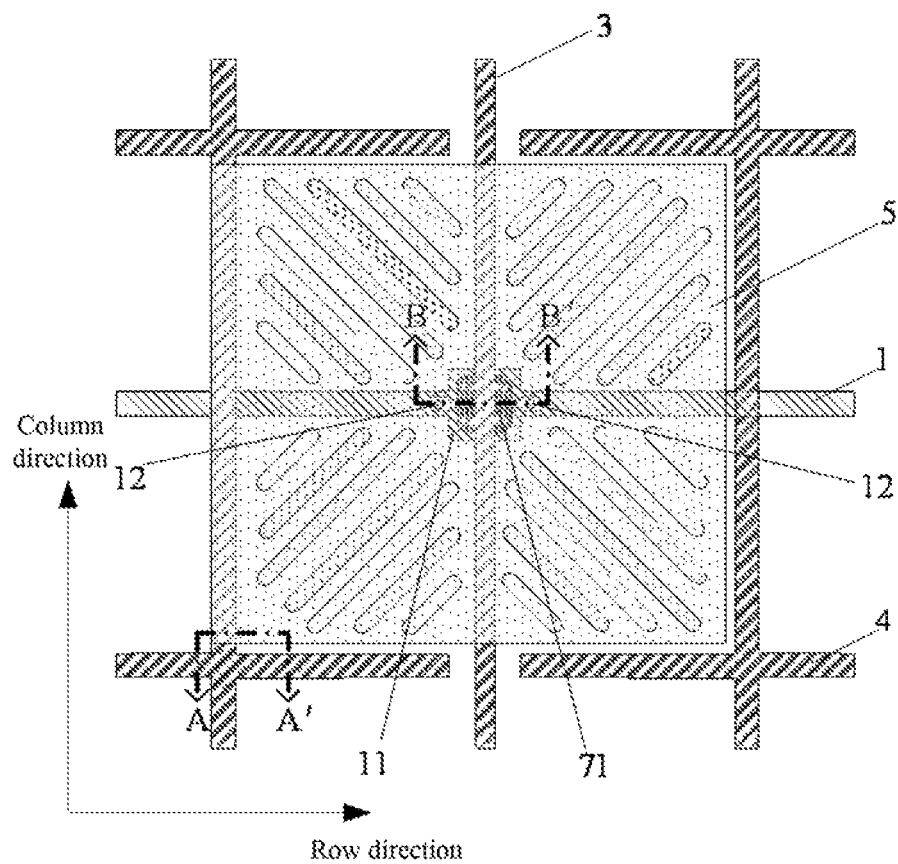
FIG. 1 illustrates a top view of an exemplary array substrate according to various disclosed embodiments of the present disclosure.

For those skilled in the art to better understand the technical solution of the invention, reference will now be made in detail to exemplary embodiments of the invention, which are illustrated in the accompanying drawings. Wherever possible, the same reference numbers will be used throughout the drawings to refer to the same or like parts.

The most prominent feature of a transparent TFT-LCD device/panel is its transparency. However, transparency results from the perception that the human eyes provide to the brain, and the perception mainly comes from the brightness of the objects behind the transparent TFT-LCD devices. Thus, in conventional transparent TFT-LCD devices, high-power illuminating devices are often mounted behind the TFT-LCD devices as the backlight, which make the TFT-LCD devices power-consuming. Transparent TFT-LCD devices without backlight consume less power, but the light transmission rate in such a LCD panel may be undesirably low. As a result, without backlight, the transparency of a TFT-LCD device is impaired.

One method to improve the transparency of a TFT-LCD device is to remove the color filters (e.g., red, green, and blue, or RGB) and form black-and-white transparent display panels. Often, after the RGB color filters are removed, the light transmission rate of an LCD panel can be increased from about 5.9% to about 22%. The method of removing the color filters can greatly improve the transparent display of a transparent TFT-LCD device without using a backlight. However, the light transmission rate of a transparent TFT-LCD device needs to be further improved.

In embodiments of the present disclosure, in a pixel region of an array substrate, at least one of the gate line and the data line is formed in the dark region between the pixel-domain regions. As a result, the gate lines and the data lines may have less impact on the aperture ratio of the array substrate. Thus, the light transmission rate of the transparent TFT-LCD panel may be further improved.

One aspect of the present disclosure provides an array substrate.

To form the disclosed array substrate, gate lines, data lines, and common electrode lines may be formed on a substrate. The common electrode lines may divide the display region of the array substrate to a plurality of pixel regions. A common electrode line may be between two adjacent pixel regions. Each pixel region may be disposed with a pixel electrode unit. A pixel region may include at least two first regions. Each first region may correspond to a pixel electrode. The pixel electrodes corresponding to the at least two first regions may form a pixel electrode unit. A first region may be, e.g., a pixel-domain region. A pixel electrode may contain a hollowed-out pattern where the pixel electrode and a corresponding first regions overlap. A pixel electrode may have a hollowed-out pattern within the corresponding first regions. An area of the pixel electrode may correspond to an area of the first region. The hollowed-out pattern may be of suitable shapes, e.g., a plurality of hollowed-out stripes or slits. Gate lines and data lines may intersect, i.e., not being aligned in parallel. When displaying images, a second region may be formed between first regions in the described multiple-domain pixel electrode. A second region may be, e.g., a dark region. For example, a second region may be formed between two adjacent first regions in a multiple-domain pixel electrode. In one embodiment, to improve light transmission rate, at least one of a gate line and a data line in a pixel region may be arranged or formed in a second region between the first regions. A TFT may be formed at the intersection of a gate line and a data line. The TFT may be electrically connected to the gate line, the data line, and the pixel electrode. A first insulating layer may be formed between the gate line and the data line. A second insulating layer may be formed between the data line and the pixel electrode.

In the present disclosure, a pixel electrode unit refers to a continuous piece of pixel electrode material. It is merely for illustrative purposes to describe a pixel electrode unit as a plurality of pixel electrodes, each corresponding to a first region. It should also be noted that, an intersection between two lines, e.g., a gate line and a data line, merely indicates that the two lines are not parallel with each other. That is, the projections of the two lines on the substrate may intersect. The term "intersect" or "intersection" do no indicate any physical or electrical connection between the two lines. In addition, to "correspond" to an object or a location may be used to describe the correspondence relationship between the physical locations of two or more objects. For example, the two or more objects may have the same location or sufficiently close locations.

In the present disclosure, a plurality of pixel regions may be formed by the common electrode lines. Each pixel region may include at least two first regions. At least one of a gate line and a data line in a pixel region may be arranged in an obscure area or a second region between first regions. By this arrangement, the gate lines and the data lines would thus have less impact on the aperture ratio of the array substrate, and the light transmission rate of the transparent TFT-LCD panel may be improved.

In one embodiment, a pixel region may include two first regions. One second region may be formed between the two first regions. One of a gate line and a data line may be arranged in the second region. For example, the gate line may be arranged in the second region. The gate line may be arranged to be perpendicular to the data line, and the common electrode line may be arranged to be parallel to the data line. Also, the data line may be arranged in the second region. The data line may be arranged to be perpendicular to the gate line in the corresponding second region, and the common electrode line may be arranged to be parallel to the gate line.

Figure 2:
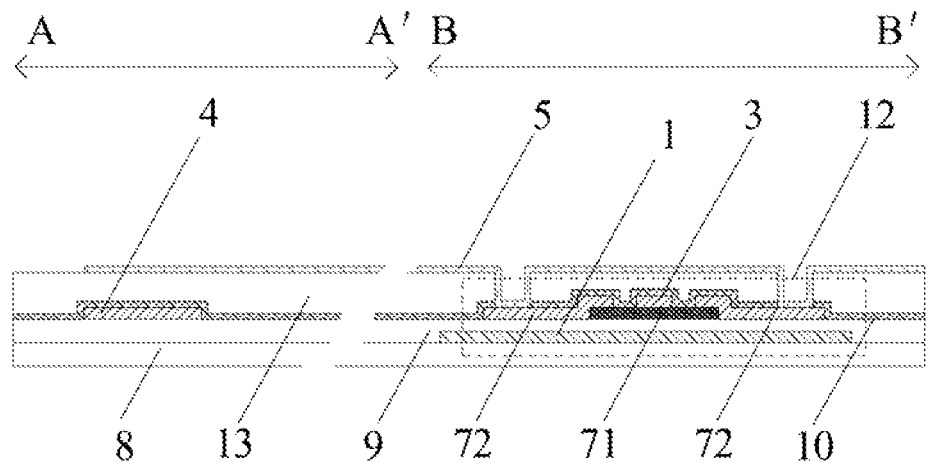
FIG. 2 illustrates cross-sectional views along the A-A' direction and the B-B' direction depicted in FIG. 1.
Figure 3:
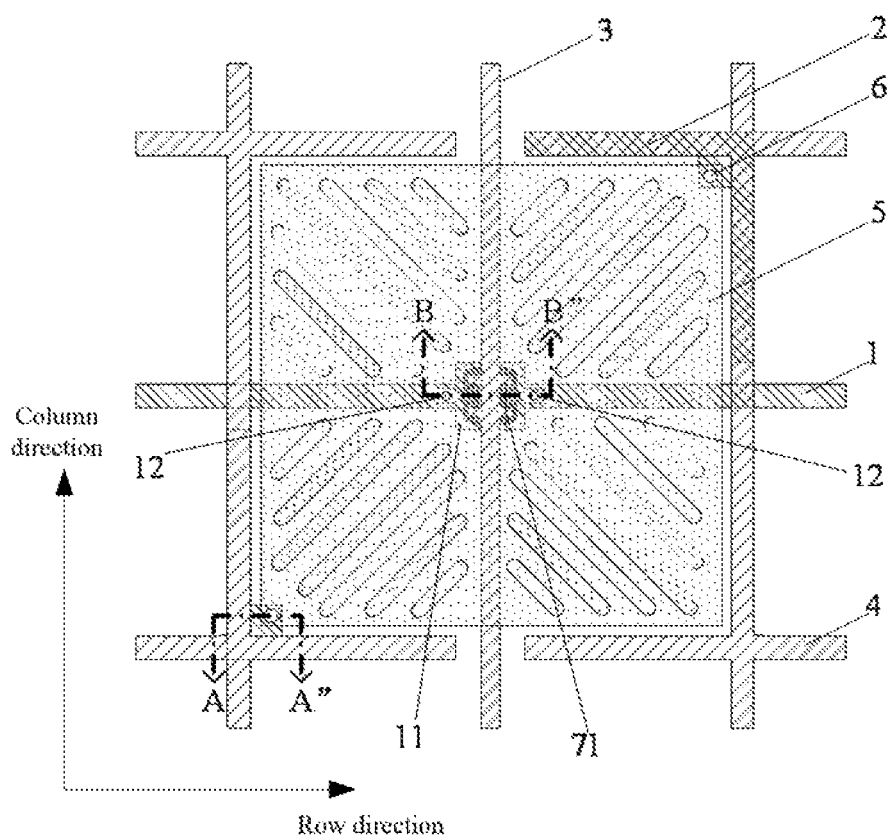
FIG. 3 illustrates a top view of another exemplary array substrate according to various disclosed embodiments of the present disclosure.
Figure 4:
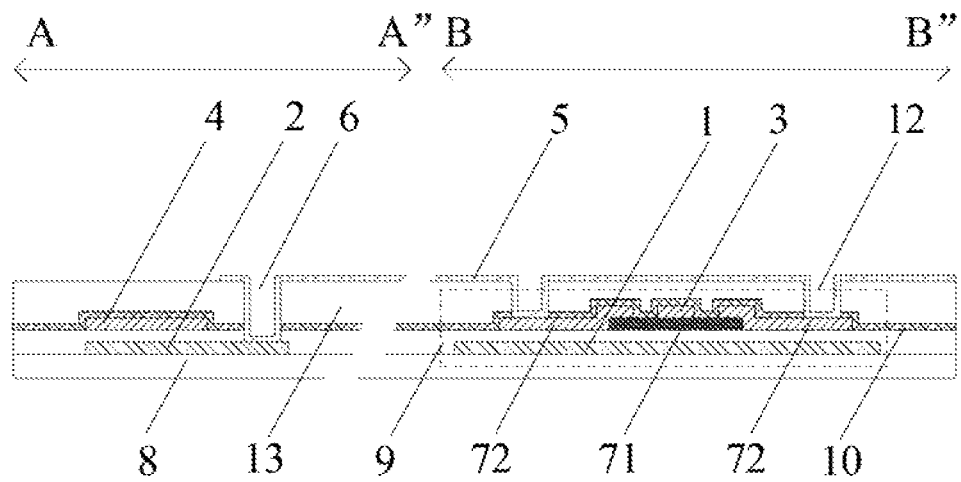
FIG. 4 illustrates cross-sectional views along the A-A" direction and the B-B" direction depicted in FIG. 3.

In another embodiment, a pixel region may include four first regions. The pixel electrode unit in the pixel region may include four pixel electrodes, each corresponding to a first region. The configuration of the array substrate may be shown in FIGS. 1-4. FIG. 1 is a top view of an exemplary array substrate. FIG. 2 illustrates the cross-sectional views of the array substrate along the A-A' direction and the B-B' direction shown in FIG. 1. FIG. 3 is a top view of another exemplary array substrate. FIG. 4 illustrates the cross-sectional views of the array substrate along the A-A" direction and the B-B" direction shown in FIG. 3. For illustrate purposes, only one pixel region is shown in FIGS. 1-4.

The array substrate may include a substrate 8. A gate line 1, a data line 3, and common electrode lines 4 may be formed on the substrate 8. The common electrode lines 4 may divide the display region of the array substrate into a plurality of pixel regions. A pixel region may include four first regions arranged in two rows and two columns, i.e., two by two configuration, as shown in FIGS. 1 and 3. Two adjacent pixel electrodes in the pixel electrode unit may contain hollowed-out patterns of different directions. For example, the two adjacent pixel electrodes along the column direction or along the row direction may contain hollowed-out patterns of different directions.

The gate line 1 and the data line 3 may be arranged to be perpendicular to each other. In the multiple-domain pixel electrode unit, a second region may be formed between two adjacent first regions. For example, for the two by two configuration depicted in FIGS. 1 and 3, two adjacent first regions may form a second region along the column direction, and two adjacent first regions may form a second region along the row direction. Thus, two second regions may be formed in the pixel region, one along the row direction and the other one along the column direction.

In some embodiments, to improve light transmission rate, the gate line 1 and the data line 3 may be formed or arranged in the second regions between first regions. For example, as shown in FIGS. 1 and 3, the gate line 1 may be formed in the second region along the row direction, and the data line 3 may be formed in the second region along the column direction. A TFT may be formed at the intersection of the gate line 1 and the data line 3, indicated by the dashed circles in FIGS. 2 and 4. The TFT may be connected to the gate line 1, the data line 3, and the pixel electrode unit 5. The first insulating layer 9 may be disposed between the gate line 1 and the data line 3. The second insulating layer 10 may be disposed between the data line 3 and the pixel electrode unit 5. For a TFT, as shown in FIGS. 2 and 4, any connection between a part and the pixel electrode unit 5 may be between the part and the pixel electrode corresponding to the TFT.

In the embodiments illustrated in FIGS. 1-4, the common electrode lines 4 may divide the display region of the array substrate to a plurality of pixel regions. Each pixel region may include four first regions arranged in two rows and two columns. The gate line 1 and the data line 3 may be formed in the second regions between adjacent first regions. Thus the gate line 1 and the data lien 3 may have less impact on the aperture ratio of the array substrate, and the light transmission rate of the transparent TFT-LCD may be improved.

Further, the hollowed-out patterns of a pixel electrode unit 5, as shown in FIGS. 1 and 3, may be symmetrical or axisymmetric with respect to the corresponding second region. For example, two hollow-patterns arranged along the column direction or row direction may be axisymmetric with respect to the second region in between. Thus, when displaying images, the electric field formed between each pixel electrode in a pixel electrode unit, i.e., corresponding to each first region, and the common electrodes may be uniform.

The array substrate provided by the present disclosure is now illustrated in detail using bottom-gated TFTs. For illustrative purposes, only one pixel is described in an embodiment. It should be noted that, for a top-gated TFT, the display region of the array substrate may also be divided into a plurality of pixel regions by the common electrode lines, and the electrode structure described in relation to the bottom-gated TFTs may also be applied to the top-gated TFTs.

As shown in FIGS. 2 and 4, a gate line 1 may be formed on the substrate 8. A data line 3, a common electrode line 4, and first electrodes 72 of a TFT may be formed through a same fabrication process, located over the gate line 1, and separated from the gate line 1 by a first insulating layer 9. The gate electrode 11 (not shown in FIGS. 2 and 4) of the TFT may be integrated with the gate line 1 as one piece or be formed through a same fabrication step. The active layer 71 of the TFT may be formed on the gate electrode 11 of the TFT and may be separated from the gate electrode 11 by the first insulating layer 9, i.e., the gate insulating layer. The active layer 71 of the TFT may be electrically connected with the first electrodes 72 of the TFT and a second electrode of the TFT. The second electrode of the TFT (not shown in FIGS. 2 and 4) may be integrated with the data line 3 as one piece or be formed through a same fabrication step. The data line 3 may be formed on the active layer 71. The pixel electrode unit 5 may be formed over the data line 3. The pixel electrode unit 5 may be connected to the first electrodes 72 of the TFT through via holes 12. The first via holes 12 may be through a second insulating layer 10.

As shown in FIGS. 2 and 4, a third insulating layer 13 may be formed between the second insulating layer 10 and the pixel electrode unit 5. The pixel electrode unit 5 may be connected with the first electrodes 72 of the TFT through the via holes 12. The via holes 12 may be through the second insulating layer 10 and the third insulating layer 13. The third insulating layer 13 may increase the thickness of the insulating material between the pixel electrode unit 5 and the data line 3 to minimize parasitic capacitance. Crosstalk during display may be reduced. The third insulating layer 13 may be made of an organic insulating material. It can be easy to form the organic insulating material that is desirably thick, to increase the distance between the pixel electrode unit 5 and the data line 3.

A storage capacitor structure may also be formed in a pixel electrode. FIGS. 1 and 2 illustrate an exemplary storage capacitor structure. As shown in FIGS. 1 and 2, the pixel electrode unit 5 and the common electrode line 4 may share an overlapped area. In the overlapped area, the pixel electrode unit 5 and the common electrode line 4 may be separated by the second insulating layer 10 and the third insulating layer 13. Thus, a storage capacitor structure may be formed between the pixel electrode unit 5 and the common electrode line 4. It should be noted that, in the present disclosure, for illustrative purposes, the pixel electrode unit 5 may overlap with one common electrode line 4. In certain other embodiments, the pixel electrode unit 5 may also overlap with more than one common electrode lines 4.

FIGS. 3 and 4 illustrate another exemplary storage capacitor structure. As shown in FIGS. 3 and 4, the array substrate may further include storage electrodes 2. A storage electrode 2 may be formed where a common electrode line 4 is formed. That is, a storage electrode 2 and a common electrode line 4 may substantially overlap. The first insulating layer 9 may be formed between the storage electrode 2 and the common electrode line 4. The storage electrode 2 may be electrically connected to the pixel electrode unit 5 through a second via hole 6. A second via hole 6 may be through the second insulating layer 10 and the third insulating layer 13. A storage capacitor structure may be formed between a storage electrode 2 and a common electrode line 4.

To reduce fabrication steps, the storage electrodes 2 may be integrated with the gate line 1, and the storage electrodes 2 and the gate line 1 may be formed through a same fabrication step.

For the disclosed array substrate, no color filters need to be formed. Thus, subpixel structures need not be formed. The pixel electrode unit 5 may have a squared shape. The pixel electrode unit 5 may contain hollowed-out patterns, which may have suitable shapes such as slits or stripes.

Another aspect of the present disclosure provides a semiconductor device.

The semiconductor device may include one or more of the disclosed array substrates, one or more of cover substrates to be aligned and bonded with the array substrates, and a liquid crystal layer between an array substrate and a cover substrate. An alignment layer may be formed on each of the array substrates and a corresponding cover substrate. The pattern of the alignment layer on the array substrate and the pattern of the alignment layer on the cover substrate may be perpendicular to each other. The perpendicular configuration of the patterns of the alignment layer may enable the second regions formed by the alignment layers to have an orthogonal configuration in the plane the alignment layers are located. The second regions formed by the alignment layers may overlap with the second regions formed by the first regions. That is, the pattern of the alignment layer on the array substrate and the pattern of the alignment layer on the cover substrate may overlap and form second regions, and the orthogonal configuration of the alignment layers may form second regions with an orthogonal configuration. Thus, the second regions formed by the alignment layers may have reduced impact on the light transmission rate of the semiconductor device. In some embodiments, the semiconductor device may be a display apparatus.

The regions on a cover substrate that correspond to or face the pixel electrode units of an array substrate may be clear, colorless and transparent to improve light transmittance. Thus, light transmission rate may be further improved.

The semiconductor device may be operated under advanced super dimension switch (ADS) mode or under twisted nematic (TN) mode. When operated under the ADS mode, common electrodes may be formed on the array substrate and may be connected with the common electrode lines. When operated under the TN mode, common electrodes may be formed on the cover substrate. In this case, the common electrodes may be connected to the common electrode lines, which are formed on the array substrate, after the cover substrate is bonded with the array substrate.

Figure 5:
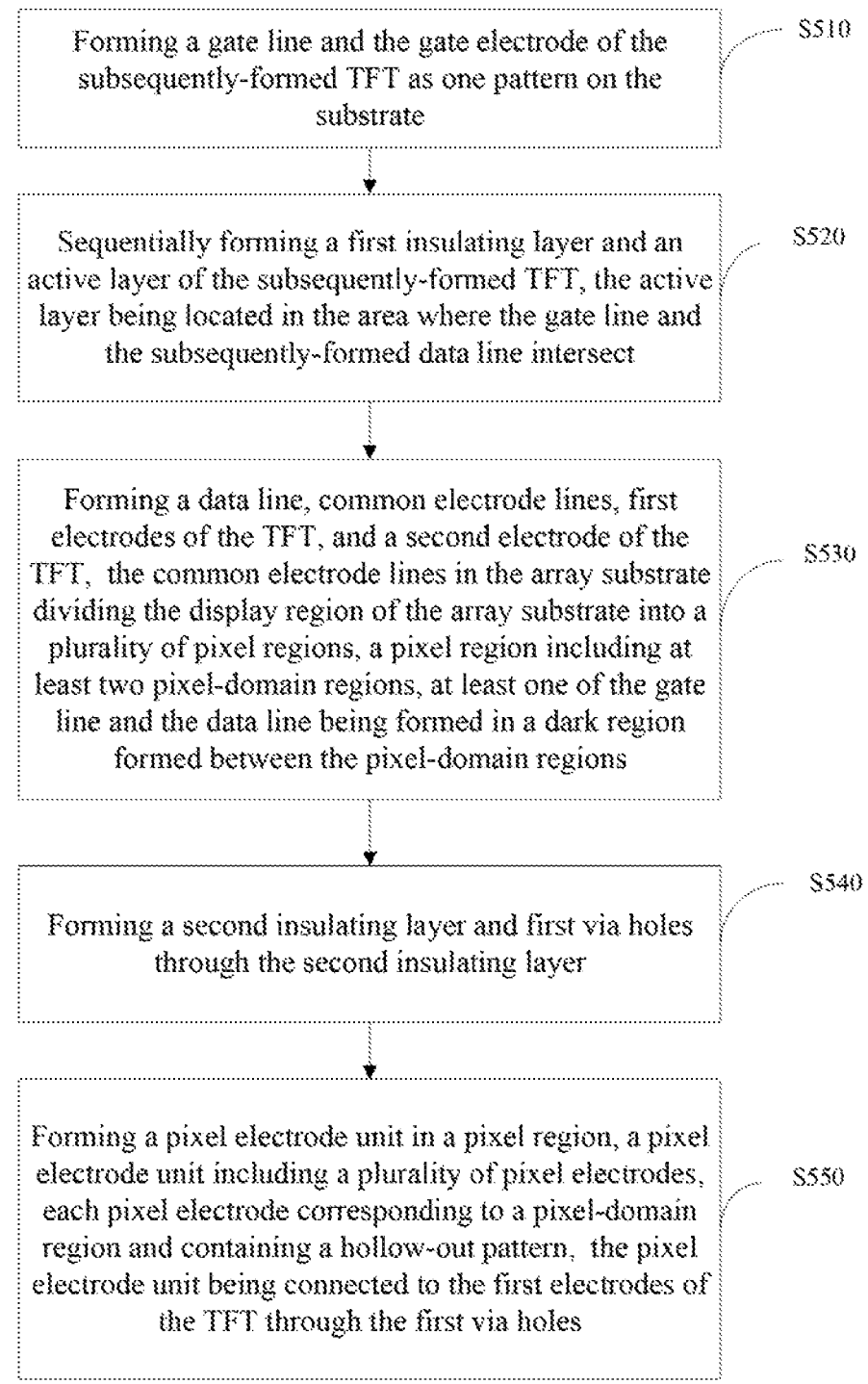
FIG. 5 illustrates an exemplary process flow for fabricating an exemplary array substrate according to various disclosed embodiments of the present disclosure.

Another aspect of the present disclosure provides a method for fabricating the array substrate. FIG. 5 illustrates an exemplary process flow of the method. The method may include steps S510-S550. For illustrative purposes, steps S510-S550 only describe the formation of one pixel structure.

In step S510, a gate line may be formed on the substrate. The gate electrode of the subsequently-formed TFT may be formed together with the gate line as one pattern.

In step S520, a first insulating layer and an active layer of the subsequently-formed TFT may be formed sequentially. The active layer may be located in the area where the gate line and the subsequently-formed data line overlap or intersect.

In step S530, a data line, common electrode lines, first electrodes of the TFT, and a second electrode of the TFT may be formed. The common electrode lines in the array substrate may divide the display region of the array substrate into a plurality of pixel regions. A pixel region may include at least two first regions. In a pixel region, the data line and the gate line may intersect. At least one of the gate line and the data line may be formed in a second region formed between the first regions.

In step S540, a second insulating layer and first via holes through the second insulating layer may be formed.

In step S550, a pixel electrode unit may be formed in a pixel region. A pixel electrode unit may include a plurality of pixel electrodes, each corresponding to a first region. Each pixel electrode may contain a hollowed-out pattern. The pixel electrode unit may be connected to the first electrodes of the TFT through the first via holes. The hollowed-out pattern may be of any suitable shapes such as stripes and slits.

Figure 6:
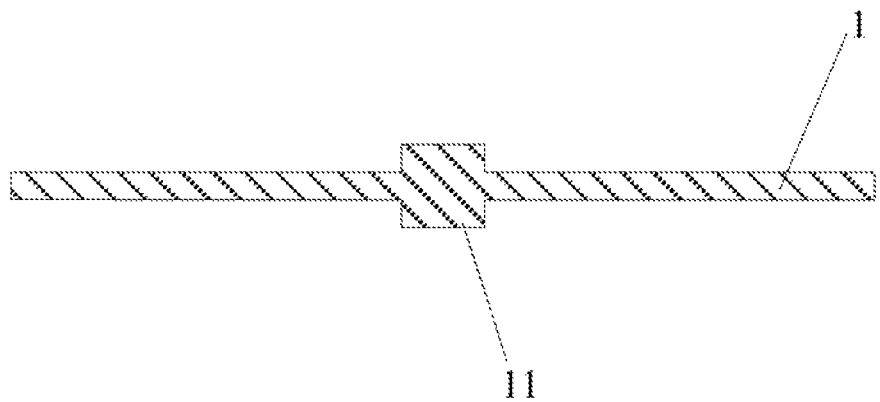
FIGS. 6-11 illustrates top views of certain parts of an array substrate at certain stages of an exemplary fabrication step.
Figure 7:
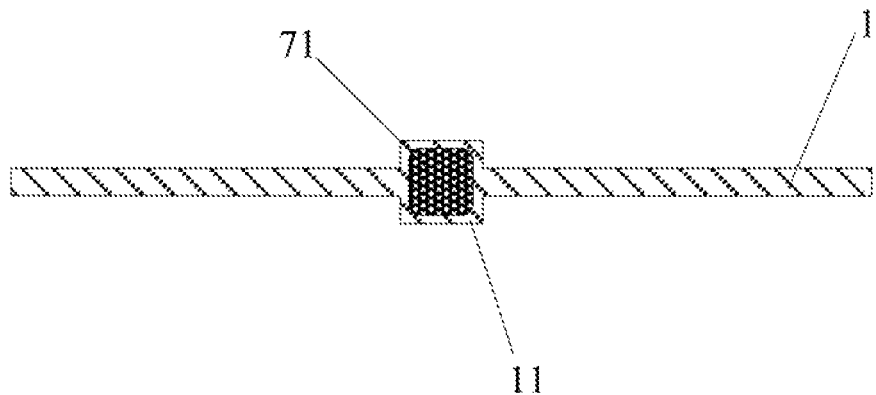
Figure 8:
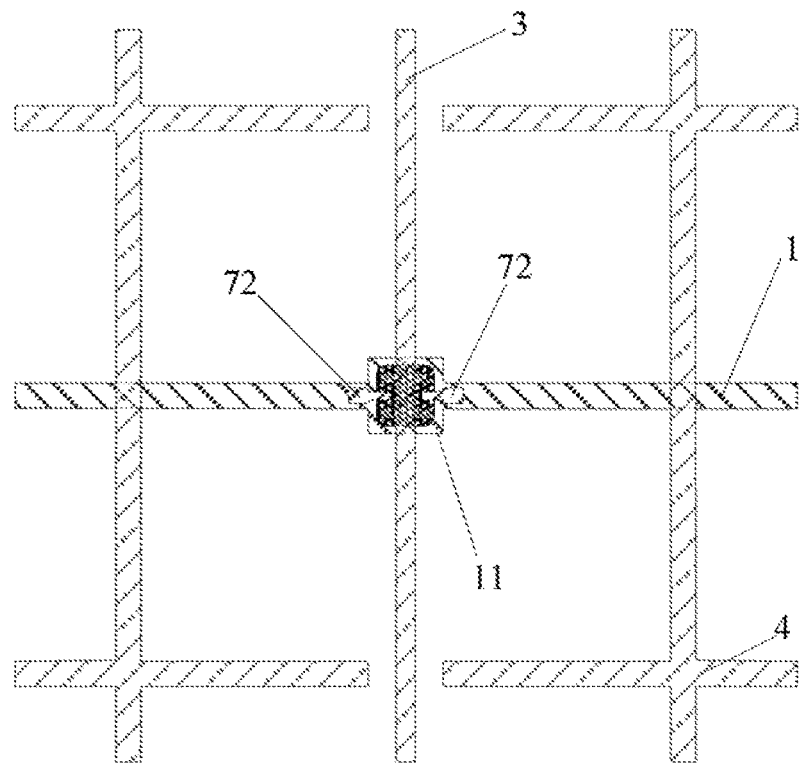
Figure 9:
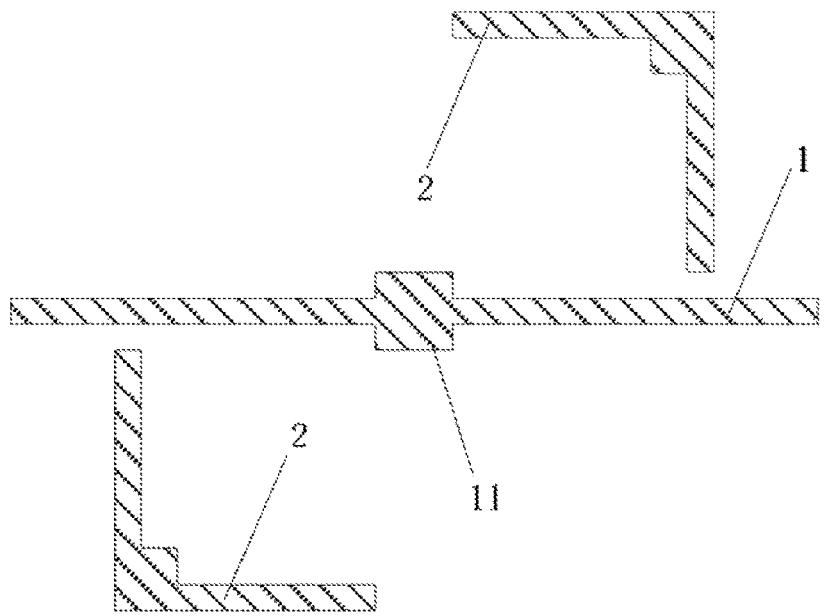
Figure 10:
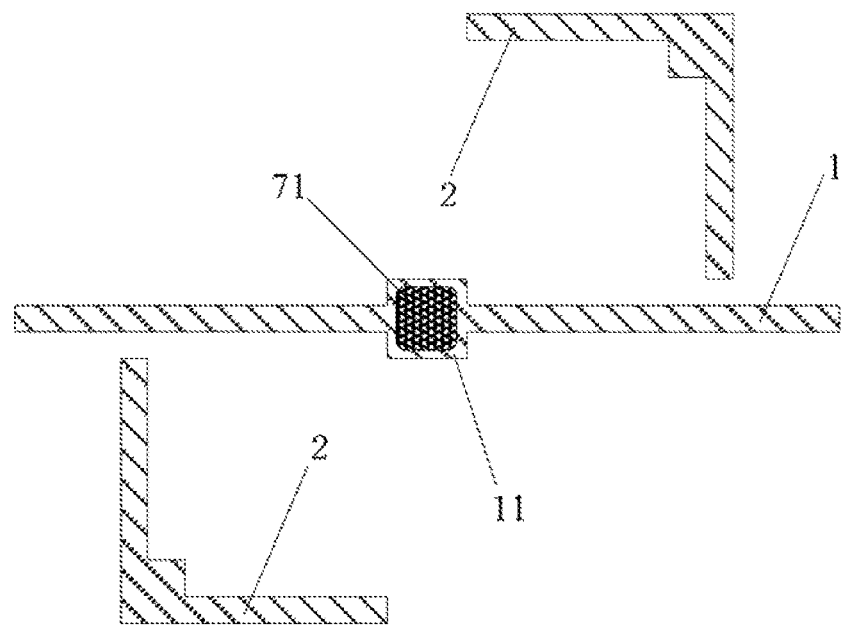
Figure 11:
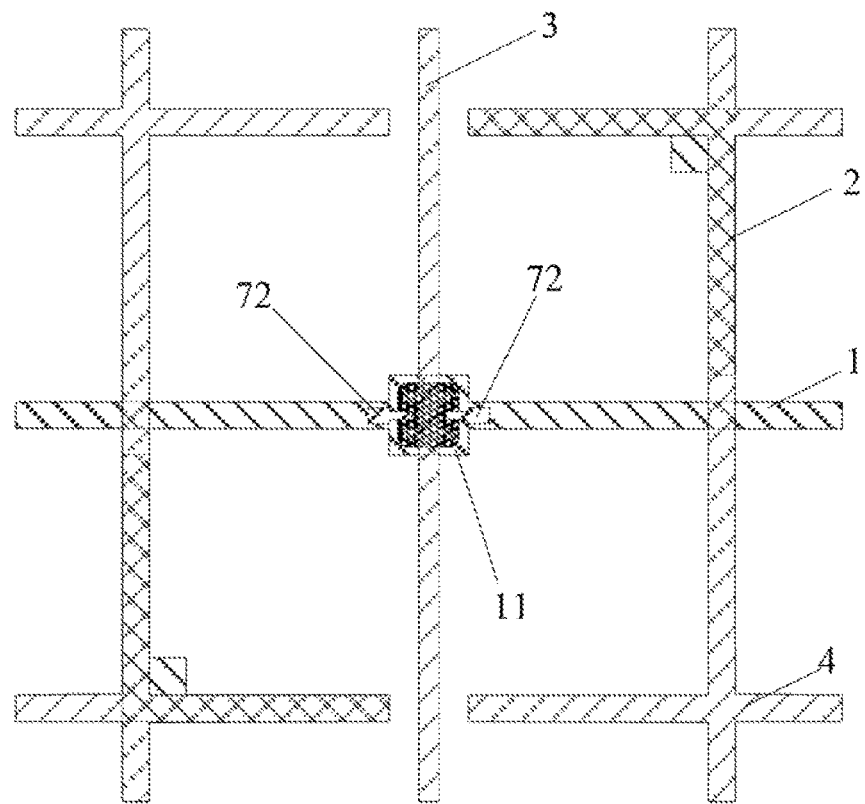

Details of the fabrication step to form the array substrates shown in FIGS. 1-4 are further exemplified in FIGS. 6-11. FIG. 6 illustrates an exemplary process to form the gate line and the gate electrode of the TFT. FIG. 7 illustrates an exemplary process to form the first insulating layer and the active layer over the gate electrode depicted in FIG. 6. FIG. 8 illustrates an exemplary process to form the data line, the common electrode lines, and the first electrodes of the TFT on the active layer depicted in FIG. 7. FIG. 9 illustrates an exemplary process to form the gate line and the gate electrode of the TFT, and the storage electrodes shown in FIG. 3. FIG. 10 illustrates an exemplary process to form the first insulating layer and the active layer over the gate line depicted in FIG. 9. FIG. 11 illustrates an exemplary process to form the data line, the common electrode lines, and the first electrodes of the TFT over the active layer depicted in FIG. 10.

FIGS. 6-8 illustrate the top views of certain parts at certain stages of an exemplary fabrication step to form the pixel structure shown in FIGS. 1 and 2.

For example, at the beginning of the fabrication step, as shown in FIG. 6, a gate line 1 and a gate electrode 11 of the subsequently-formed TFT may be formed on the substrate 8. For viewing simplicity, the substrate 8 is not shown in FIG. 6.

Further, as shown in FIG. 7, the first insulating layer (not shown) and the active layer 71 may be formed. The active layer 71 may be formed at the area where the gate line 1 and the subsequently-formed data line 3 intersect.

Further, as shown in FIG. 8, the data line 3, the common electrode lines 4, and the first electrodes 72 of the subsequently-formed TFT in a pixel region may be formed. The common electrode lines 4 of the array substrate may divide the display region into a plurality of pixel regions. In a pixel region, the gate line 1 and the data line 3 may be perpendicular to each other. The gate line 1 and the data line 3 may be formed in the second regions between the subsequently-formed first regions. The two by two first regions may each correspond to a pixel electrode of the subsequently-formed pixel electrode unit.

Further, a second insulating layer and first via holes may be formed. The first via holes may be through the second insulating layer.

Further, the pixel electrode unit with four pixel electrodes, arranged in a two by two configuration, may be formed. Each pixel electrode may correspond to a first region. The pixel electrode unit may be connected to the first electrodes 72 of the TFT through the first via holes. Thus, a pixel structure shown in FIGS. 1 and 2 may be formed.

To reduce the crosstalk between the pixel electrode unit and the data line 3, after forming the second insulating layer and before forming the pixel electrode unit, a third insulating layer may be formed on the second insulating layer. The first via holes may be through the third insulating layer and the second insulating layer. In some embodiments, the third insulating layer may be made of an organic insulating material.

In some embodiments, to form a storage capacitor structure, when forming the pixel electrode unit, the pixel electrode unit and the common electrode line may overlap. The second insulating layer and the third insulating layer may be formed between the pixel electrode unit and the common electrode line such that the storage capacitor structure may be formed.

FIGS. 9-11 illustrate the top views of certain parts at certain stages of an exemplary fabrication step to form the pixel structure shown in FIGS. 3 and 4.

As shown in FIG. 9, at the beginning of the fabrication step, when forming the gate line 1 on the substrate, a storage electrode 2 may be formed in the area a common electrode line 4 is subsequently-formed. In one embodiment, two storage electrodes 2 may be formed, as shown in FIG. 9.

Further, as shown in FIG. 10, the first insulating layer and the active layer 71 may be formed. The active layer 71 may be located at the area the gate line 1 and the subsequently-formed data line 3 intersect.

Further, as shown in FIG. 11, the data line 3, the common electrode lines 4, and the first electrodes 72 of the TFT may be formed. The common electrode lines 4 of the array substrate may divide the display region of the array substrate into a plurality of pixel regions. In a pixel region, the gate line 1 and the data line 3 may be perpendicular to each other. The gate line 1 and the data line 3 may be formed in the second regions between the subsequently-formed first regions. The two by two first regions may each correspond to a pixel electrode of the subsequently-formed pixel electrode unit.

Further, when forming the second insulating layer, first via holes may be formed in the areas the first electrodes 72 are located. The first via holes may be through the second insulating layer to be connected with the first electrodes 72. Second via holes may be formed in the areas where the storage electrodes 2 are located. The second via holes may be through the first insulating layer and the second insulating layer. The subsequently-formed pixel electrode unit may be connected with the storage electrodes 2 through the second via holes. A storage electrode 2 and a common electrode line 4 may form a storage capacitor structure.

Further, the pixel electrode unit may be formed. The pixel electrode unit may include four pixel electrodes arranged in a two by two configuration. Each pixel electrode may correspond to a first region. The pixel electrode unit may be connected to the first electrodes 72 of the TFT through the first via holes, and may be connected to the storage electrode 2 through a second via hole. Thus, the pixel structure shown in FIGS. 3 and 4 may be formed.

To reduce the crosstalk between the pixel electrode unit and the data line 3, after forming the second insulating layer and before forming the pixel electrode unit, a third insulating layer may be formed on the second insulating layer. The first via holes may be through the third insulating layer and the second insulating layer. The second via holes may be through the third insulating layer, the second insulating layer, and the first insulating layer. In some embodiments, the third insulating layer may be made of an organic insulating material.

The disclosed array substrate and the fabrication method have several advantages. By optimizing the design of the pixels, at least one of the gate line and the data line is formed in the second region between the first regions in a pixel region. The gate line and the data line may have less impact on the aperture ratio of the array substrate, and the aperture ratio may thus be less impaired. The light transmission rate of the transparent TFT-LCD panel may be improved.

It should be understood that the above embodiments disclosed herein are exemplary only and not limiting the scope of this disclosure. Without departing from the spirit and scope of this invention, other modifications, equivalents, or improvements to the disclosed embodiments are obvious to those skilled in the art and are intended to be encompassed within the scope of the present disclosure.

What is claimed is:

1. An array substrate, comprising:
a substrate having a display region with a plurality of pixel regions, each pixel region having two or more first regions and being separated from at least two neighboring pixel regions by at least two common electrode lines;
a gate line;
a data line intersecting with the gate line, at least one of the gate line and the data line being in a second region between the two adjacent first regions; and
a plurality of pixel electrodes each having a hollowed-out pattern and being within a corresponding first region, pixel electrodes corresponding to the two or more first regions being a pixel electrode unit,
wherein a gap exists between an orthogonal projection of the pixel electrode unit on the substrate and an orthogonal projection of one of the at least two common electrode lines on the substrate.

2. The array substrate according to claim 1, wherein:
each pixel electrode corresponds to a first region, and an area of the pixel electrode corresponds to an area of the first region.

3. The array substrate according to claim 1, further comprising:
a first insulating layer between the gate line and the data line; and
a second insulating layer between the data line and the pixel electrode unit.

4. The array substrate according to claim 1, wherein:
a pixel region includes four first regions arranged in a two by two configuration; and
the gate line and the data line are in the second region and are perpendicular to each other.

5. The array substrate according to claim 4, wherein:
hollowed-out patterns of two adjacent pixel electrodes are axisymmetric.

6. The array substrate according to claim 1, wherein:
the hollowed-out pattern includes one or more of slit shapes and stripe shapes.

7. The array substrate according to claim 2, further comprising a thin-film transistor, the thin-film transistor comprising:
a gate electrode integrated with the gate line;
first electrodes electrically connected to the pixel electrode unit;
a second electrode integrated with the data line;
an active layer electrically connected to the first electrodes and the second electrode,
wherein:
the data line, the at least two common electrode lines, and the first electrodes are over the gate electrode;
the data line, the at least two common electrode lines, and the first electrodes are separated from the gate electrode by a first insulating layer;
the gate electrode and the gate line are on the substrate;
the active layer is on the gate electrode and is separated from the gate electrode by the first insulating layer, the active layer being electrically connected with the first electrodes and the second electrode;
the second electrode and the data line are one piece; and
the pixel electrode unit is over the data line, the pixel electrode unit being connected to the first electrodes through first via holes, and the first via holes being through the second insulating layer.

8. The array substrate according to claim 7, further comprising:
a third insulating layer between the second insulating layer and the pixel electrode,
wherein:
the first via holes are through the second insulating layer and the third insulating layer, and
the pixel electrode unit is connected to the first electrodes through the first via holes.

9. The array substrate according to claim 8, wherein the third insulating layer is made of an organic insulating material.

10. The array substrate according to claim 1, further comprising a storage electrode formed in areas corresponding to one of the at least two common electrode lines, wherein:
the first insulating layer is between the storage electrode and the one of the at least two common electrode lines; and
the storage electrode is electrically connected to the pixel electrode and forms a storage capacitor structure with the one of the at least two common electrode lines.

11. The array substrate according to claim 10, wherein: the storage electrode is integrated with the gate line.

12. The array substrate according to claim 11, wherein:
one of the at least two common electrode lines substantially overlaps with the pixel electrode unit; and
the second insulating layer is between the one of the at least two common electrode lines and the pixel electrode unit.

13. The array substrate according to claim 1, wherein the pixel electrode is of a squared shape.

14. A semiconductor device, comprising the array substrate according to claim 1.

15. The semiconductor device according to claim 14, further comprising:
a cover substrate with a clear region corresponding to the pixel electrode for improving light transmittance.

16. A method for fabricating an array substrate, comprising:
providing a substrate having a display region with a plurality of pixel regions, each pixel region having two or more first regions and a second region between two adjacent first regions;
forming a gate line and a gate electrode of a thin-film transistor on the substrate, the gate line and the gate electrode of the thin-film transistor being formed in a same fabrication step;
forming a first insulating layer;
forming an active layer of the thin-film transistor;
forming a data line, at least two common electrode lines separating each pixel region from at least two adjacent pixel regions, first electrodes, and a second electrode, at least one of the gate line and the data line being formed in the second region, and the gate line and the data line intersecting in an area containing the active layer;
forming a second insulating layer and first via holes, the first via holes being through the second insulating layer; and
forming a pixel electrode unit including a plurality of pixel electrodes with hollowed-out patterns in the pixel region and being connected to the first electrodes through the first via holes, the hollowed-out patterns corresponding to the first regions,
wherein a gap exists between an orthogonal projection of the pixel electrode unit on the substrate and an orthogonal projection of one of the at least two common electrode lines on the substrate.

17. The method according to claim 16, wherein:
the hollowed-out pattern includes one or more of slit shapes and stripe shapes;
each pixel region includes four first regions arranged in a two by two configuration; and
the gate line and the data line are perpendicular to each other and are fabricated in the second region.

18. The method according to claim 16, further comprising:
forming a third insulating layer on the second insulating layer, the first via holes being through the third insulating layer and the second insulating layer.

19. The method according to claim 16, further comprising:
forming a storage electrode in an area corresponding to one of the at least two common electrode lines, the storage electrode and the gate line being formed in a same fabrication step; and forming a second via hole in an area corresponding to the storage electrode, the second via hole and the second insulating layer being formed in a same fabrication step, the second via hole being through the first insulating layer and the second insulating layer, and the pixel electrode unit being connected to the storage electrode through the second via hole.

20. The method according to claim 16, wherein the pixel electrode unit overlaps with one of the at least two common electrode lines.

* * * * *